United States Patent [19]

Thaniyavarn

[11] Patent Number: 4,878,724
[45] Date of Patent: Nov. 7, 1989

[54] ELECTROOPTICALLY TUNABLE PHASE-LOCKED LASER ARRAY

[75] Inventor: Suwat Thaniyavarn, Bellevue, Wash.
[73] Assignee: TRW Inc., Redondo Beach, Calif.
[21] Appl. No.: 79,552
[22] Filed: Jul. 30, 1987
[51] Int. Cl.$^4$ ............................................. G02B 6/10
[52] U.S. Cl. .............................. 350/96.14; 350/96.15; 372/33
[58] Field of Search .................. 350/96.13, 96.14, 355, 350/96.15, 96.12; 372/50, 33

[56] References Cited

U.S. PATENT DOCUMENTS

| | | | |
|---|---|---|---|
| 3,795,433 | 3/1974 | Channin | 350/96.14 |
| 3,944,820 | 3/1976 | Stotts | 350/96.14 |
| 4,058,722 | 11/1977 | Taylor | 350/96.14 |
| 4,175,827 | 11/1979 | McMahon | 350/96.14 |
| 4,273,411 | 6/1981 | Alferness | 350/355 |
| 4,285,569 | 8/1981 | Yao et al. | 350/96.14 |
| 4,360,921 | 11/1982 | Scifres et al. | 372/50 |
| 4,462,658 | 7/1984 | Scifres et al. | 350/96.14 |
| 4,502,037 | 2/1985 | Le Parquier et al. | 350/96.14 |
| 4,607,909 | 8/1986 | Sanford | 350/96.14 |
| 4,667,331 | 6/1987 | Alferness et al. | 372/20 |
| 4,684,207 | 8/1987 | Lawless | 350/96.14 |
| 4,725,131 | 2/1988 | Goodwin et al. | 372/50 |
| 4,731,670 | 3/1988 | Allen et al. | 350/96.13 |
| 4,732,445 | 3/1988 | Sabatier et al. | 350/96.13 |
| 4,748,632 | 5/1988 | Preston | 372/32 |
| 4,751,709 | 6/1988 | Matsumoto et al. | 372/50 |
| 4,798,437 | 1/1989 | Rediker et al. | 350/96.14 |

FOREIGN PATENT DOCUMENTS 0027648  3/1977  Japan ............................... 350/96.14

OTHER PUBLICATIONS

Takizawa; "Electrooptic Fresnel Lens . . . : Channel Waveguides"; Applied Optics; vol. 22, No. 16; 08/15/1983; pp. 2468–2473.
Lattes et al; "An Ultrafast All-Optical Gate"; IEEE Journal of Quantum Electronics, vol. QE19, No. 11, Nov. 11; Nov. 1983; pp. 1718–1723.

Primary Examiner—Frank Gonzalez
Attorney, Agent, or Firm—James M. Steinberger; Sol L. Goldstein

[57] ABSTRACT

An electrooptically tunable waveguide array combined with a semiconductor phase-locked laser array, to provide both amplitude shaping and phase control of the optical output. The tunable waveguide array includes an input waveguide array section with an array spacing matching that of the laser array, a tunable coupling array section for tailoring power distribution among the array elements, a tunable phase shifter array section for tailoring the relative phase distribution among the array elements, and an output waveguide array section of various possible configurations. The tunable waveguide array can be implemented either externally, independent of the laser array, or incorporated into the laser array to form a composite cavity-array.

7 Claims, 5 Drawing Sheets

ELECTROOPTICALLY TUNABLE PHASE-LOCKED LASER ARRAY

BACKGROUND OF THE INVENTION

This invention relates generally to solid-state laser arrays and, more particularly, to techniques for achieving a desirable far-field radiation pattern from arrays of this type. It is well known that high output powers can be obtained from arrays of semiconductor lasers if the individual lasers can be phase locked. Ideally, a phase-locked laser array should produce a coherent optical beam having an extremely narrow beam width that is limited only by diffraction effects, known as a diffraction-limited beam. Moreover, the ideal far-field distribution pattern is single-lobed.

Most laser arrays exhibit multi-lobed far-field radiation patterns, with divergence angles in excess of the diffraction limit. A number of different approaches have been proposed to achieve the desired single-lobed and diffraction-limited beam, usually involving modification of the array structure or of the simple lasing action of the semiconductor lasers making up the array. One such method is to control the electrical currents through the laser elements on an individual basis, using separate electrical contacts. This is impractical in many cases, especially if the number of array elements is large.

Other techniques involve the modification of the laser array structure to change the coupling characteristics of adjacent elements. These approaches often require some compromise in the desired output characteristics, such as the output power, the single-lobed nature of the far-field pattern, the angular beam width, and so forth.

Phase-adjustment of lasers formed in gallium arsenide has been proposed, for example in Scifres U.S. Pat. Nos. 4,360,921 and 4,462,658 et al. The structure disclosed in the Scifres et al. patents is monolithic, i.e. a laser is fabricated on the same structure as a waveguide. The Scifres et al. structure includes an array of electrodes employed to produce a phase retardation along the wavefront of a propagating light beam, thereby effecting a desired angular scanning action of the beam, or focusing it as desired. Another application of electrooptically induced phase changes is shown in Yao U.S. Pat. No. 4,285,569 et al. This patent discloses an integrated optical modulator array in which a uniform grating and a chirped grating are used to provide an array of beams, which are then subject to phase adjustment in an electrooptic modulator.

It will be apparent from the foregoing that there is still a need for improvement in the field of semiconductor laser arrays. In particular, there is a need for a simple array structure that can achieve a desirable far-field output pattern, with a predominantly single-lobed and diffraction-limited beam, but without the disadvantages of the prior art. The present invention satisfies this need.

SUMMARY OF THE INVENTION

The present invention resides in a completely tunable waveguide section for use with a semiconductor laser array. The tunable waveguide section does not require modification of the simple laser structure of the array. Basically, and in general terms, the structure of the invention comprises either or both of two optical adjusting means, one of which is means for adjusting the relative amplitude of multiple optical beams from multiple laser elements of an array, and the other of which is means for adjusting the relative phase of the same multiple optical beams.

More specifically, the waveguide structure of the invention includes an electrooptically tunable waveguide coupling section, to ensure that the elements of the array have a desired amplitude or intensity relationship, and an electrooptically tunable phase shifter waveguide section, to ensure that the elements of the array are in perfect phaselocked relationship. With the application of appropriate electrical signals, the elemental optical beams of the array can be exactly matched in amplitude and phase, and the far-field output pattern obtained is close to the ideal single-lobed, diffraction-limited one.

The waveguide sections of the invention can be combined with the associated laser array in either an internal or external manner. In other words, the waveguide sections may be integrated into a single lasing cavity with the laser array elements, or may be positioned at the laser output facets, but not incorporated into the laser cavity.

In the tunable waveguide coupling section, light from the laser elements is passed through an array of waveguides that are closely spaced, to permit coupling between them, and electrodes positioned adjacent to the waveguides are used to apply an electric field to the waveguides in a direction perpendicular to the propagation direction. The electrooptic effect causes changes in the refractive index in the waveguides, which in turn effects changes in the degree of coupling between the waveguides. By adjustment of the voltages applied to the electrodes, the relative amplitudes of the light in the individual waveguides can be controlled to give a desired amplitude distribution across the array.

In the tunable phase shifter waveguide section, there is no coupling between adjacent waveguides. Coupling can be eliminated by wider spacing of the waveguides or by dielectric loading. Because there is no inter-waveguide coupling, electrodes applying an electric field to the individual waveguides affect only the phase delay in each waveguide, and not the amplitude. With appropriate tuning, the waveguides can provide an array of outputs that is not only in a locked phase relationship, but in which there is a zero phase difference between the phases of the elements.

In accordance with one aspect of the invention, one or both of these tunable waveguide sections are butt-coupled to a semiconductor laser array, but are optically "external" to the laser array. What is meant by this is that end facets of the waveguide sections are coated with an antireflective material, to minimize reflection of light back into the laser array, and the emitting facet of the laser array is partially reflective to define one mirrored limit of the laser cavity of the array. In an alternative form of the invention, the tunable sections are internal to the laser array. In this case the emitting facet of the laser array is antireflective, but the emitting facet of the tunable sections is partially reflective, to extend the laser cavity to include the tunable sections as well as the laser array itself.

In accordance with another aspect of the invention, the waveguide structure further includes a beam forming section, which may take any of a variety of alternative forms. The beam forming section may merge the multiple waveguides into one output waveguide, or may further divide the optical power propagated in the waveguides into a larger number of waveguides, depending on the application of the array. Many of the beam forming alternatives would not be possible without the precise control of relative phase and amplitude distribution afforded by the tunable sections of the invention.

It will be appreciated from the foregoing that the present invention represents a significant advance in the field of semiconductor laser arrays. In particular, the invention provides the control of both the amplitude and relative phase of individual elements of a laser array, thereby permitting precise control of the output characteristics of the array. Single-lobed far-field patterns and practically diffraction-limited output beams can be obtained from laser arrays of uncomplicated design, even when manufacturing tolerances do not provide laser elements having uniform power distribution across the array. Other aspects and advantages of the invention will become apparent from the following more detailed description, taken in conjunction with the accompanying drawings.

DESCRIPTION OF THE PREFERRED EMBODIMENTS

Figure 1A:
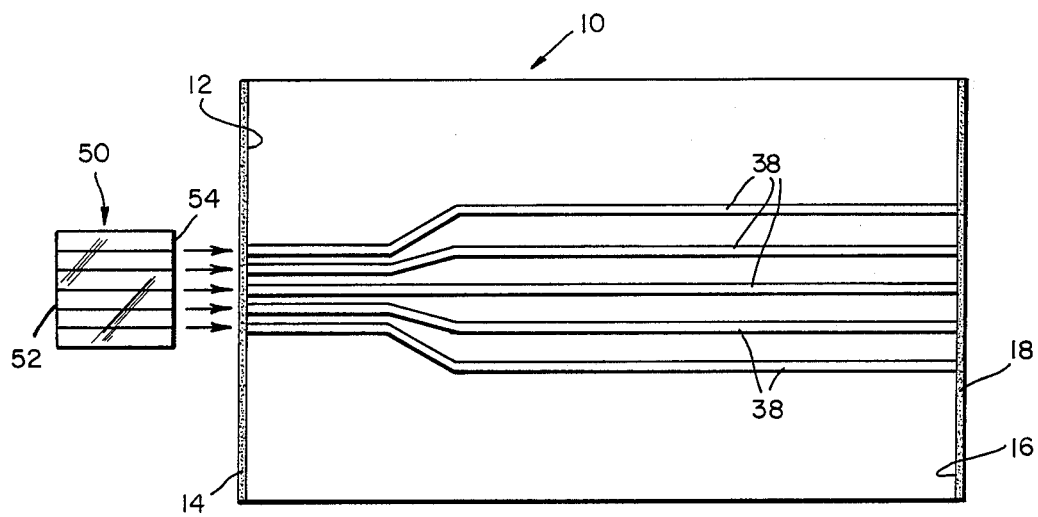
FIG. 1a is a top plan view showing a phase-locked semiconductor laser array coupled to a tunable waveguide section in accordance with the invention.

As shown in the drawings for purposes of illustration, the present invention is concerned with semiconductor laser arrays, and with techniques for controlling the output characteristics of such arrays. Although phase-locked semiconductor laser arrays have their individual laser elements locked in a fixed phase relationship, it is not always the desired phase relationship. In fact, the phase relationship that is naturally favored in such structures places adjacent laser elements out of phase by 180 degrees. Moreover, fabrication techniques have not been developed to the point where uniform power output is obtained from all of the laser elements in an array.

Figure 2:
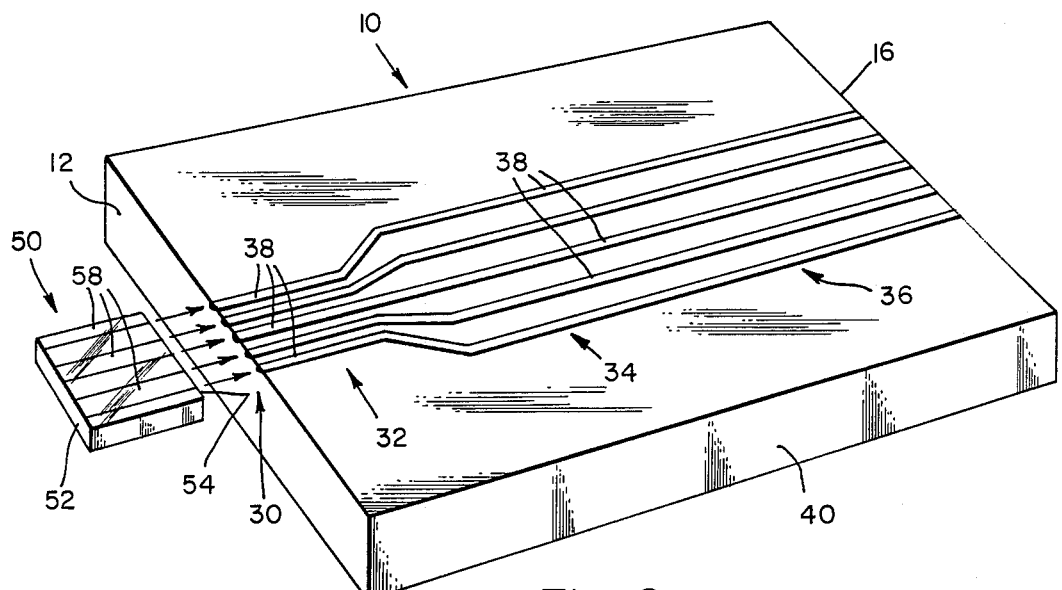
FIG. 2 is a schematic representation, in perspective, of the composite electrooptically tunable waveguide section of the invention and the laser array.

In accordance with the invention, a phase-locked semiconductor laser array, indicated by reference numeral 50 in the drawings, is coupled to a waveguide section 10 that is electrooptically tunable to produce desired amplitude and phase relationships among the laser elements. The component parts of the waveguide section 10 are best shown in FIG. 2. Multiple beams from the laser array 50 are launched into the waveguide section 10, as indicated at 30. It will be understood that the waveguide section 10 is shown separated from the laser array 50 purely for purposes of illustration. In fact the two components are butt-coupled together, to minimize losses at the interface between them.

Basically, the waveguide section 10 includes an electrooptically tunable coupling section 32, and electrooptically tunable phase shifter section 34, and an output waveguide section 36. A plurality of waveguides 38, five of which are illustrated, extend through the three sections of the waveguide structure 10, and are formed on a substrate 40. In the coupling section 32, the waveguides 38 are relatively closely spaced, matching the spacing of the laser elements in the laser array 50, and there is coupling of energy between the waveguides in this section.

Figure 3:
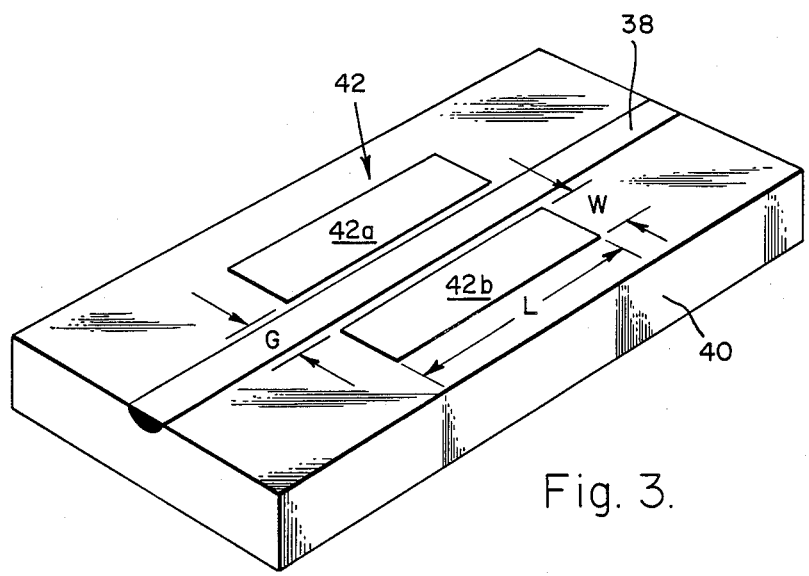
FIG. 3 is an enlargement of a portion of FIG. 2, showing the relationship of electrodes to an optical waveguide.

In the coupling section 32 and in the phase shifter section 34, there are electrodes 42 (shown only in FIG. 3) for applying an electric field perpendicular to the direction of propagation of light in the waveguides. As shown by way of example in FIG. 3, the electrodes 42 include first and second electrodes 42a and 42b disposed on the substrate 40 on each side of a waveguide 38. When a voltage is applied across the electrode pair 42a, 42b, an electric field extends through the waveguide beneath the substrate surface, and a change in the index of refraction is electrooptically induced. This modifies the degree of coupling between adjacent waveguides, and affects the amplitude or intensity of light emerging from the coupling section 32.

Depending on the waveguide spacings, multiple pairs of electrodes can be employed adjacent to each waveguide, with different voltages applied to each pair as needed. Alternatively, a more convenient arrangement is to locate only one electrode between each two adjacent waveguides and one on each side of the entire set of waveguides. Each electrode located between two adjacent waveguides serves both of the waveguides, and the voltages can be selected to provide each waveguide with the appropriate electric field. By appropriate selection of the electrode lengths L and the applied voltages, coupling between the waveguides can be adjusted to provide a desired amplitude distribution across the array. Although the parameters can be derived theoretically, in practice it is a relatively simple matter to measure the output intensities of the individual waveguides and adjust the input voltages until a desired distribution is obtained.

In the phase shifter section 34, the waveguides 38 are spaced further apart to avoid interwaveguide coupling, but the electrode structure is identical to that employed in the coupling section 32 of the waveguide structure 10. Other techniques may be employed to decouple the waveguides, such as capacitive loading of the waveguides. In any event, because the waveguides 38 in the phase shifter section 34 are not coupled, the application of an electric field to any of waveguides, using a structure similar to that of FIG. 3, causes a phase shift in the propagating optical wave. The electrooptical effect by means of which this occurs is well known. Accordingly, the relative phases of the individual laser outputs can be separately controlled in the phase shifter section 34. If desired, an array of light beams with zero degrees of phase shift between them can be obtained, and the resultant far-field radiation distribution pattern will be close to the desired single-lobed, diffraction-limited beam. The length L and the gap G between pairs of electrodes are used to control the electrooptic effect, as is well known. The phase shift induced in the waveguide is proportional to the product of the voltage and the electrode length. One possibility, therefore, is to employ a single voltage and to induce various phase shifts determined by the electrode lengths. This assumes that the phase shifts are determinable in advance of fabrication of the electrode structures.

It should be noted that the electrodes 42 have been omitted from the figures (except FIG. 3) for clarity of illustration. Moreover, the waveguides in many of the figures are shown as single lines.

In one form of the invention, the waveguide structure 10 is implemented externally, as depicted in FIG. 1a. That is to say the input end 12 of the waveguide structure is provided with an anti-reflective coating 14, and the output end 16 is also provided with an anti-reflective coating 18. Therefore, minimal reflection is fed back from these surfaces to the laser array 50. Both end facets 52 and 54 of the laser array 50 are cleaved to provide a mirrored surface, and the laser array therefore operates without interference from the waveguide structure 10.

Figure 1B:
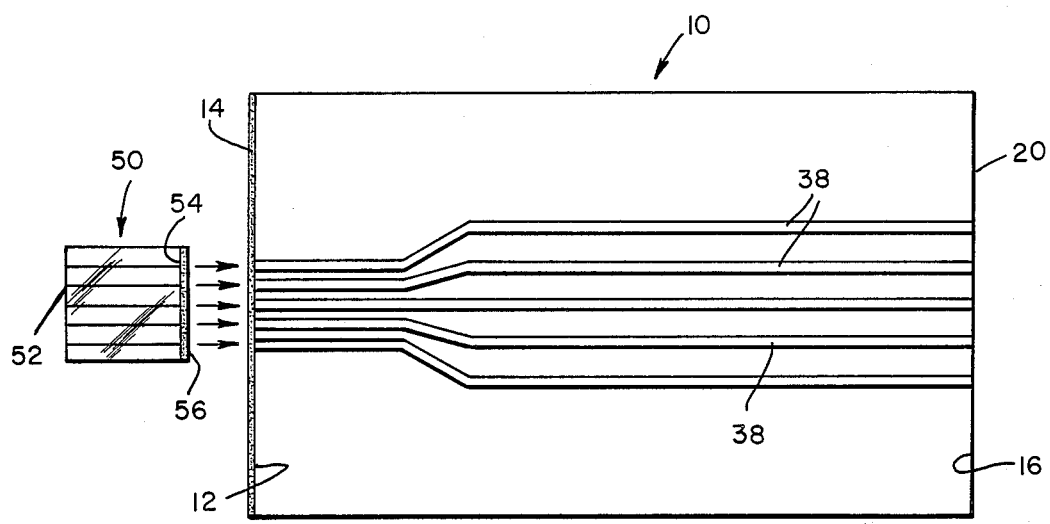
FIG. 1b is a top plan view similar to that of FIG. 1a, but depicting composite-cavity coupling of the waveguide structure to the laser array.

The alternative form of the invention is the internal or composite-cavity form, shown in FIG. 1b, in which waveguide structure 10 is incorporated into the laser cavity of the laser array 50. In this case, the output end 16 of the waveguide structure 10 is provided with a partially reflective mirror coating 20, and the input end 12 of the waveguide structure and the output end 54 of the array are provided with anti-reflective coatings 14 and 56, respectively. As before, the opposite end 52 of the laser array 50 is cleaved to provide a mirrored surface.

For coupling the waveguide structure 10 to the laser array 50, butt-coupling is preferably employed. Although other forms of coupling, such as gratings, evanescent field couplers, and lenses, may be used, most other forms of coupling present stability problems and are therefore not as practical as butt-coupling. Butt-coupling techniques for associatively coupling a diode and an optical waveguide are known. For example, see the paper entitled "Observations and Theory of High-Power Butt Coupling to LiNbO$_3$-type Waveguides," by Jacob M. Hammer et al., IEEE Trans. on Microwave Theory and Techniques, Vol. MTT-30, No. 10, October 1982, p.1739.

The diode laser array 50 comprises a plurality of individual diode laser elements 58, fabricated in accordance with well known techniques. For example, gallium arsenide / gallium aluminum arsenide (GaAs/GaAlAs) diode lasers are well suited to the practice of the invention.

Fabrication of the waveguide structure 10 of the invention is also in accordance with conventional techniques. The substrate 40 is typically of a suitable electro-optical material, such as lithium niobate (LiNbO$_3$), with the waveguides 38 being of in-diffused titanium (Ti). Other possible materials include LiTaO$_3$ with Cu (copper) diffusion of the waveguides, and BaTiO$_3$ with Sb diffusion to form the waveguides. For LiNbO$_3$ substrates, single-mode low-loss waveguides are formed by in-diffusion of Ti and the waveguide profile is controlled by varying the Ti thickness, the waveguide width, the diffusion temperature, and the diffusion time, following well known techniques. The waveguide profile is controlled to maximize the coupling between the waveguides and semiconductor array 50. The efficiency of the coupling between the laser array 50 and the waveguide structure 10 has been demonstrated to be at least 60 percent. The typical - waveguide propagation loss is as low as 0.3 to 0.5 dB/cm, and the total length of the waveguide structure 10 is about 3 to 5 cm.

Figure 4:
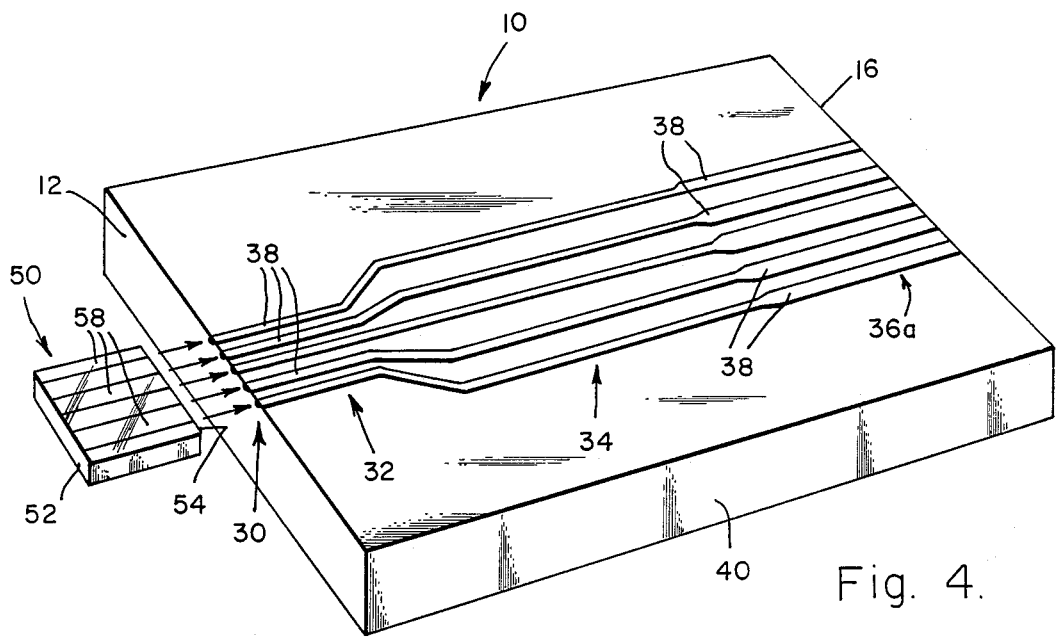
FIG. 4 is a schematic representation similar to that of FIG. 2, but depicting an output waveguide array section with variable width spacing of the waveguides to form a lens-like array.
Figure 5:
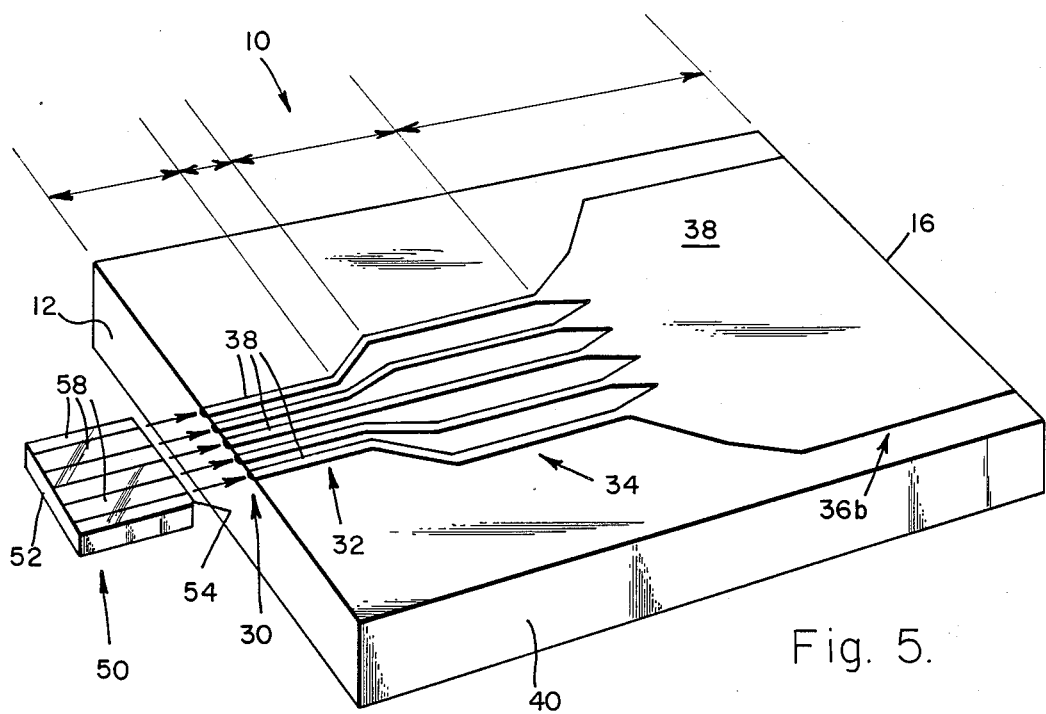
FIG. 5 is a schematic representation similar to that of FIG. 2, but depicting an output waveguide array section with mixing and beam expansion, to form a planar output.

The use of an external waveguide array technique for enlarging and collimating a beam is illustrated in FIGS. 4 and 5. The external waveguide structure 10 is fabricated on lithium niobate if tuning for phase and amplitude distribution is a requirement. The beam forming section 36 of the waveguide structure 10 takes different forms in FIGS. 4 and 5. In FIG. 4, the beam forming section 36a includes multiple output waveguide segments of expanded width. The width and spacing of these output waveguide segments can be adjusted to form a lenslike array performing such functions as beam expansion and collimation. This array 36a is basically a Fresnel-type lens. If the phase relations of the array elements are appropriately adjusted, the output from the array 36a can be focused to an extremely narrow spot. By readjusting the phase relations between the array elements, the focal point can be moved toward or away from the waveguide structure, providing a longitudinal spatial light modulator.

An alternative form of this configuration is shown in FIG. 5, wherein the waveguides 38 merge into a single output waveguide section 36b. The single output waveguide section 36b provides a planar wavefront output if the phases of the individual elements are appropriately adjusted in the waveguide structure 10.

Probably the most important application of the invention is that of a power combiner. The laser array 50 can be easily designed to operate with its individual laser elements locked in a constant phase relationship. However, the phase relationship may not be the desired one. On the contrary, it is known that a natural selection process in the array favors oscillation in a mode in which adjacent laser elements are 180 degrees out of phase. Various techniques have been proposed to modify this naturally favored mode, mostly requiring departures from a simple laser structure. The waveguide structure 10 of the invention permits complete control of the relative phase of the individual laser outputs. If desired, all the outputs can be locked together in phase, to provide a single-lobed far-field output pattern.

Figure 6:
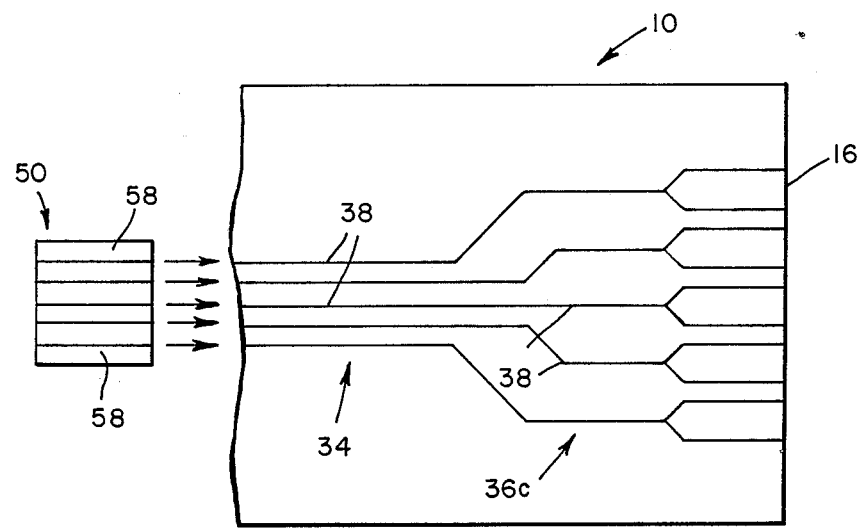
FIG. 6 is a top plan view, in schematic form, of yet another output configuration.
Figure 7:
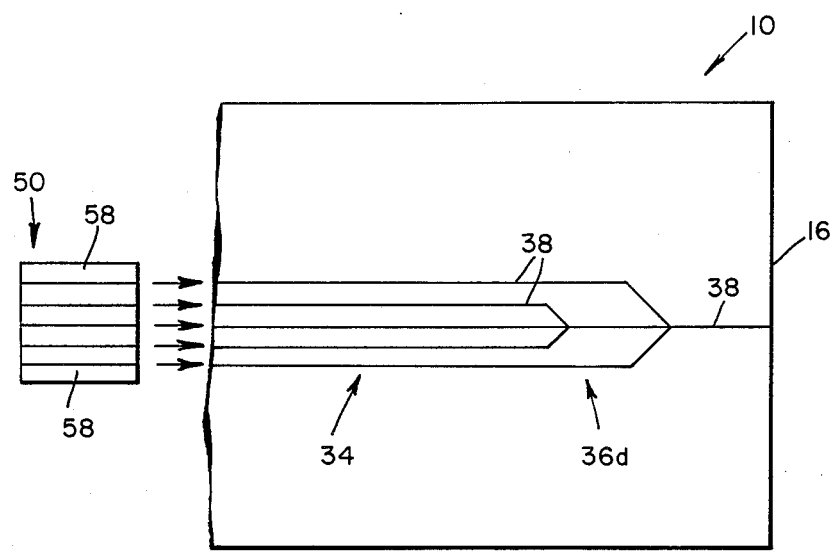
FIG. 7 is a top plan view, in schematic form, of still another output configuration.

FIG. 6 shows another output beam-forming configuration, in which the waveguides 38 diverge from each other, and then each divides into two waveguides in a Y junction. The resultant output configuration produces multiple outputs of greater number than the number of elements in the laser array. The use of Y junctions in this manner affords control over the output beam width. The inverse of this structure is shown in FIG. 7, in which the waveguides 38 converge at successive junctions to produce a single-channel output from the waveguide structure.

As mentioned earlier, the Fresnel lens output configuration of FIG. 4 can be used for longitudinal spatial light modulation. Transverse modulation or beam scanning is also achievable by appropriate detuning of an in-phase relationship of the array elements.

Another application of the structure of the invention is in frequency tuning and stabilization of laser arrays. It is well known that an external cavity can be usefully employed with semiconductor lasers for wavelength stabilization. If the phase shifter section of the invention is used to control the phase of elements of the array, the optical path length of the cavity can be adjusted, and therefore the lasing wavelength. This technique permits the adjustment of the wavelength of the entire array or the separate wavelength adjustment of individual lasing elements.

Figure 8:
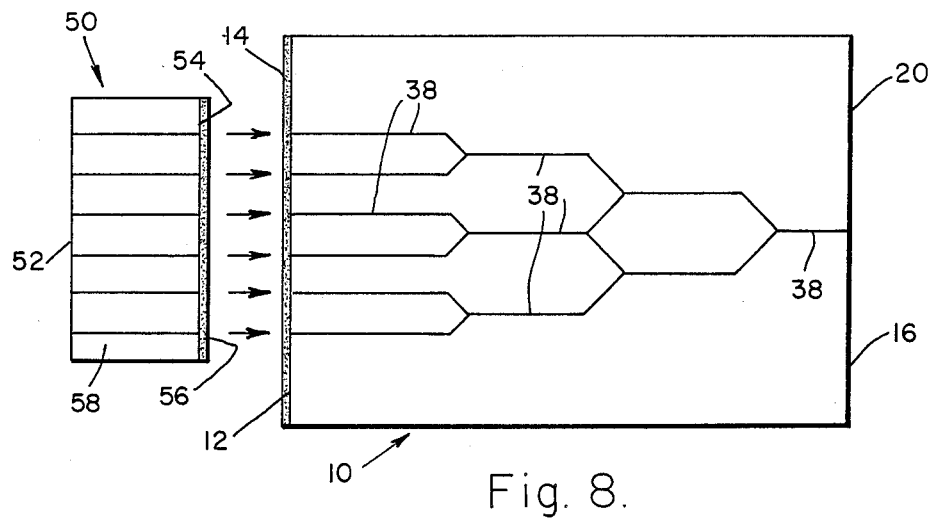
FIG. 8 is a top plan view, in schematic form, of a composite cavity array having a reduced number of outputs.
Figure 9:
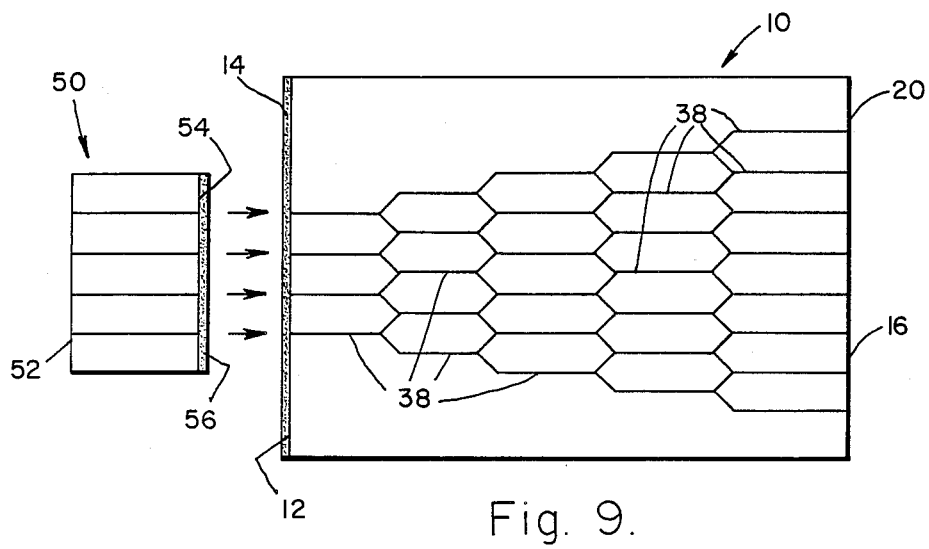
FIG. 9 is a top plan view, in schematic form, of a composite cavity array having an expanded number of outputs.
Figure 10:
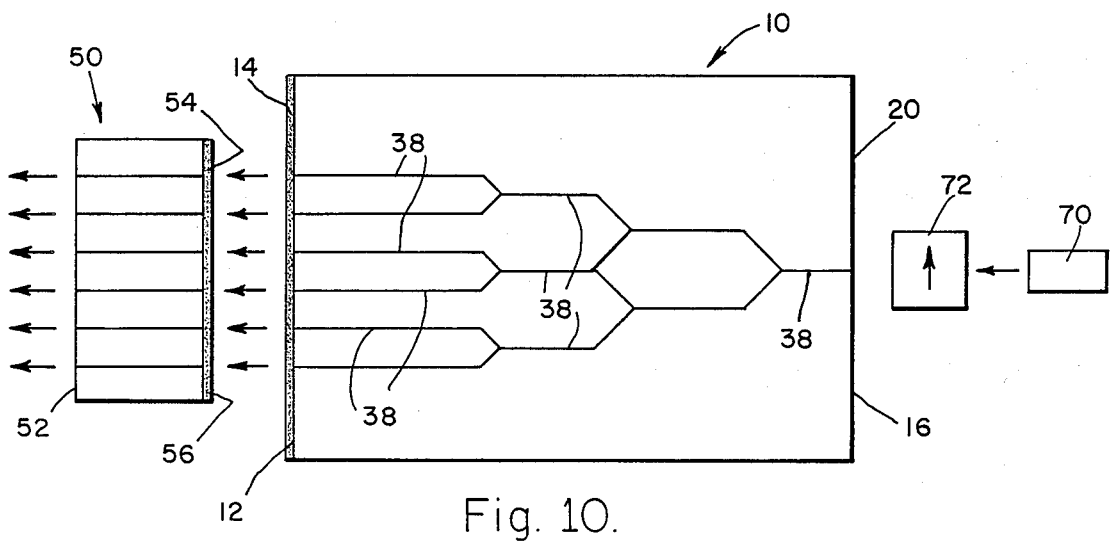
FIG. 10 is a top plan view, in schematic form, showing a stable master laser coupled to a composite-cavity array.

FIGS. 8-10 show additional output configurations well suited for use with the invention. The three configurations shown in these figures are of the "internal" type, where the waveguide structure 10 is incorporated into the laser cavity of the laser array 50. Also, it is to be understood that the waveguide structure 10 in each of the three figures includes the waveguide coupling section 32 and the phase shifter section 34, even though only the output section 36 is illustrated. It is known in the art that a Y-junction array of the type shown in FIGS. 8-10 forces the phases in both arms of the Y to be the same, i.e. a zero phase difference. FIG. 8 illustrates a power combiner in which the waveguides 38 are merged together using Y junctions, to provide a single output, for coupling to a single fiber (not shown).

In FIG. 9, a Y-junction array in the output section expands the number of outputs. The waveguide structure 10 can be tuned to provide phase locking to a number of phase and amplitude conditions, to provide, if desired, single-lobed far-field radiation, spatial modulation of the beam, and control of beam divergence.

In the embodiment shown in FIG. 10, the principle of injection locking is employed to stabilize the frequency and phase of the laser array 50. A stable master laser 70 injects energy into the "output" end of the waveguide structure 10, which includes a Y-junction array identical with the one shown in FIG. 8. The master laser 70 is isolated from the waveguide array 10 by a suitable optical isolator 72. The laser array 50 is effectively slaved to the master laser 70 in frequency and phase, and emits light from its facet 52 opposite the one that is adjacent to the waveguide structure 10.

Although the embodiments of FIGS. 8-10 would ideally operate as illustrated, i.e. without the individual control over amplitude and phase provided by the invention, in practice there are differences in ideally identical components that preclude the desired mode of operation. The invention provides total control of the phase and amplitude of each waveguide, and permits ideal operation to be closely approached.

Another important aspect of the invention is that its hybrid construction, whereby the laser array is fabricated separately from the waveguide structure, permits independent optimization of the two components. The fabrication of a laser array involves considerations and trade-offs that are best kept separate from other considerations concerning the fabrication of electrooptical waveguides. Moreover, it is desirable for some applications to fabricate relatively large or complex output beam-forming sections, which would not be possible in a monolithic structure. Accordingly, it is preferred that the waveguide structure and the laser array structure of the invention be fabricated separately and butt-coupled in the manner described.

It will be appreciated from the foregoing that the present invention represents a significant advance in the field of semiconductor laser arrays. In particular, the invention provides a technique for controlling the phase, or the amplitude, or both, of light emitted from each of a plurality of laser elements in an array. This principle can be applied to a variety of devices, including power combiners, spatial light modulators, optical beam scanners, optical beam profile shapers, and so forth. It will also be appreciated that, although a number of embodiments of the invention have been described in detail for purposes of illustration, various modifications may be made without departing from the spirit and scope of the invention. Accordingly, the invention is not to be limited except as by the appended claims.

I claim:

1. A waveguide structure for controlling the characteristics of the optical outputs of a semiconductor laser array having multiple laser elements coupled to the waveguide structure, comprising:

a first plurality of substantially parallel waveguides formed in an electrooptical material, the waveguides being optically coupled along their lengths;

a plurality of electrodes formed adjacent to the first plurality of waveguides for inducing changes in the degree of optical coupling between the waveguides to provide control of the relate amplitudes of the optical outputs of the laser elements;

a second plurality of substantially parallel waveguides formed in the electrooptical material and optically coupled to the first plurality of waveguides, the second plurality of waveguides being optically uncoupled along their lengths; and a plurality of electrodes formed adjacent to the second plurality of waveguides for inducing changes in the relative phases of the optical outputs of the laser elements;

whereby both the amplitude and phase of the optical outputs of the laser elements are controlled to produce a desired optical output from the waveguide structure.

2. A waveguide structure as defined in claim 1, and further comprising:

an output beam-forming waveguide section formed in the electrooptical material and optically coupled to the output of the waveguide structure, to modify the characteristics of the optical output of the waveguide structure.

3. A waveguide structure as defined in claim 2, wherein the output beam-forming waveguide section includes:

a set of lens-like waveguides.

4. A waveguide structure as defined in claim 2, wherein the output beamforming waveguide section includes:

a single waveguide into which the optical output of the waveguide structure converges.

5. A waveguide structure as defined in claim 2, wherein the output beam-forming waveguide section includes:

an array of interconnected Y junctions coupled to a larger plurality of output waveguides.

6. A waveguide structure as defined in claim 2, wherein the output beam-forming waveguide section includes:

an array of interconnected Y junctions coupled to a single output waveguide.

7. A waveguide structure as defined in claim 1, wherein the first plurality of waveguides are spaced closely enough to permit optical coupling between the waveguides and the second plurality of waveguides are spaced widely enough to prevent optical coupling between the waveguides.

* * * * *